United States Patent [19]
Erdeljac et al.

[11] Patent Number: 5,554,873
[45] Date of Patent: Sep. 10, 1996

[54] SEMICONDUCTOR DEVICE HAVING POLYSILICON RESISTOR WITH LOW TEMPERATURE COEFFICIENT

[75] Inventors: John P. Erdeljac, Plano; Louis N. Hutter, Richardson, both of Tex.

[73] Assignee: Texas Instruments Incorporated, Dallas, Tex.

[21] Appl. No.: 475,116

[22] Filed: Jun. 7, 1995

Related U.S. Application Data

[62] Division of Ser. No. 247,443, May 23, 1994, Pat. No. 5,489,547.

[51] Int. Cl.$^6$ .................................................. H01L 27/02
[52] U.S. Cl. .................. 257/380; 257/538; 257/359; 257/363; 257/516; 257/904
[58] Field of Search .................................. 257/538, 359, 257/363, 379, 380, 381, 576, 904

[56] References Cited

U.S. PATENT DOCUMENTS

| | | | |
|---|---|---|---|
| 4,208,781 | 6/1980 | Rao et al. | 437/918 |
| 4,209,716 | 6/1980 | Raymond, Jr. | 257/379 |
| 4,370,798 | 2/1983 | Lien et al. | 29/576 B |
| 4,377,819 | 3/1983 | Sakai et al. | 257/379 |
| 4,391,650 | 7/1983 | Pfeifer et al. | 148/1.5 |
| 4,416,049 | 11/1983 | McElroy | 29/571 |
| 4,419,812 | 12/1983 | Topich | 29/571 |
| 4,467,519 | 8/1984 | Glang et al. | 437/60 |
| 4,577,390 | 3/1986 | Haken | 29/570 |
| 4,579,600 | 4/1986 | Shah et al. | 148/15 |
| 4,679,170 | 7/1987 | Bourassa et al. | 365/154 |
| 5,187,559 | 2/1993 | Isobe et al. | 257/538 |
| 5,196,233 | 3/1993 | Chan et al. | 437/60 |
| 5,198,382 | 3/1993 | Campbell et al. | 437/46 |
| 5,218,225 | 6/1993 | Zanders | 257/538 |
| 5,273,924 | 12/1993 | Chan et al. | 437/46 |
| 5,313,087 | 5/1994 | Chan et al. | 257/538 |
| 5,352,923 | 10/1994 | Boyd et al. | 257/538 |
| 5,365,099 | 11/1994 | Phipps et al. | 257/328 |
| 5,448,103 | 9/1995 | de Witt | 257/379 |

FOREIGN PATENT DOCUMENTS 0109988  4/1993  Japan ................................. 257/538

*Primary Examiner*—Robert P. Limanek
*Assistant Examiner*—David B. Hardy
*Attorney, Agent, or Firm*—James W. Brady III.; Richard L. Donaldson

[57] ABSTRACT

A semiconductor device having a p type polysilicon resistor (56) with a moderate sheet resistance and low temperature coefficient of resistance is formed by a double-level polysilicon process. The process also produces n and p-channel transistors (44, 50), a capacitor having upper and lower n type polysilicon capacitor plates (36, 26), an n type polysilicon resistor (32) having a high sheet resistance, and an n type resistor (34) having a low sheet resistance. The p type doping used to form the source/drain regions (48) of p-channel transistor (50) counterdopes n type second level polysilicon to form p type polysilicon resistor (56) without effecting capacitor plates (36, 26) or the n type resistors (32, 34).

4 Claims, 8 Drawing Sheets

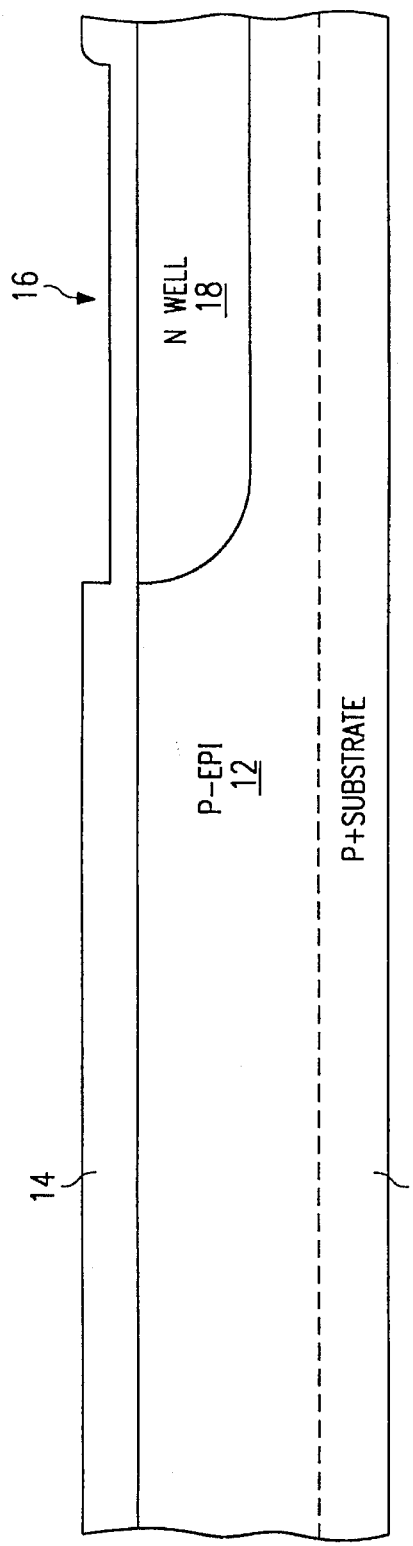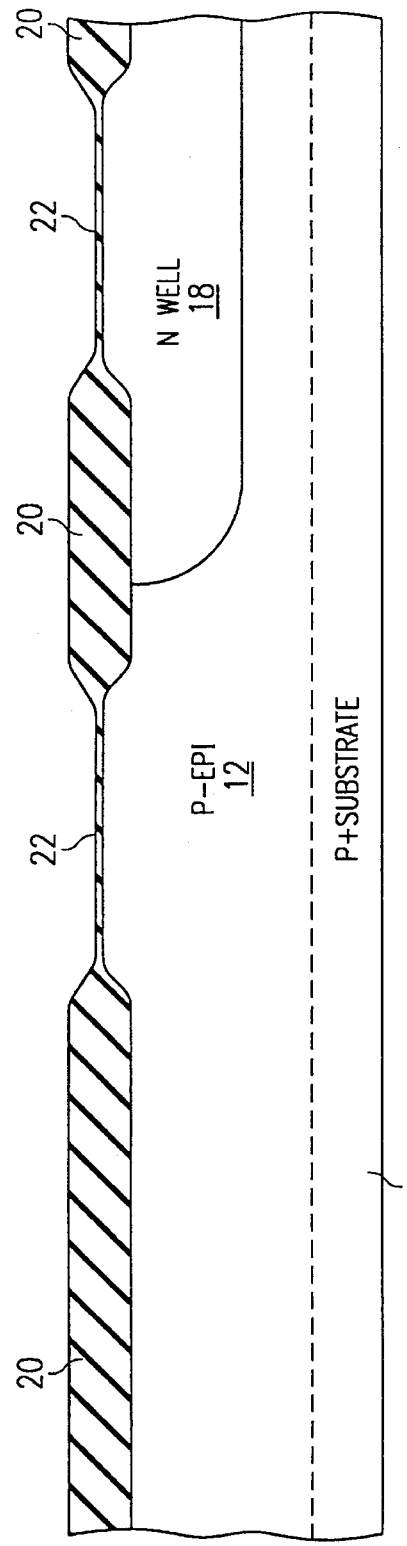
FIG. 1 (PRIOR ART)
FIG. 2 (PRIOR ART)

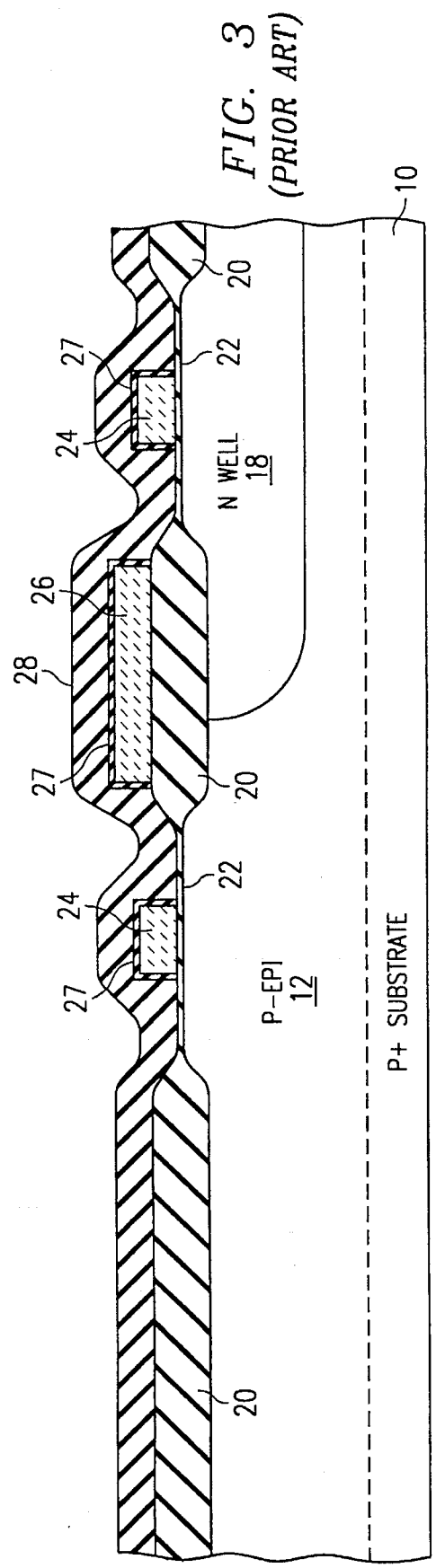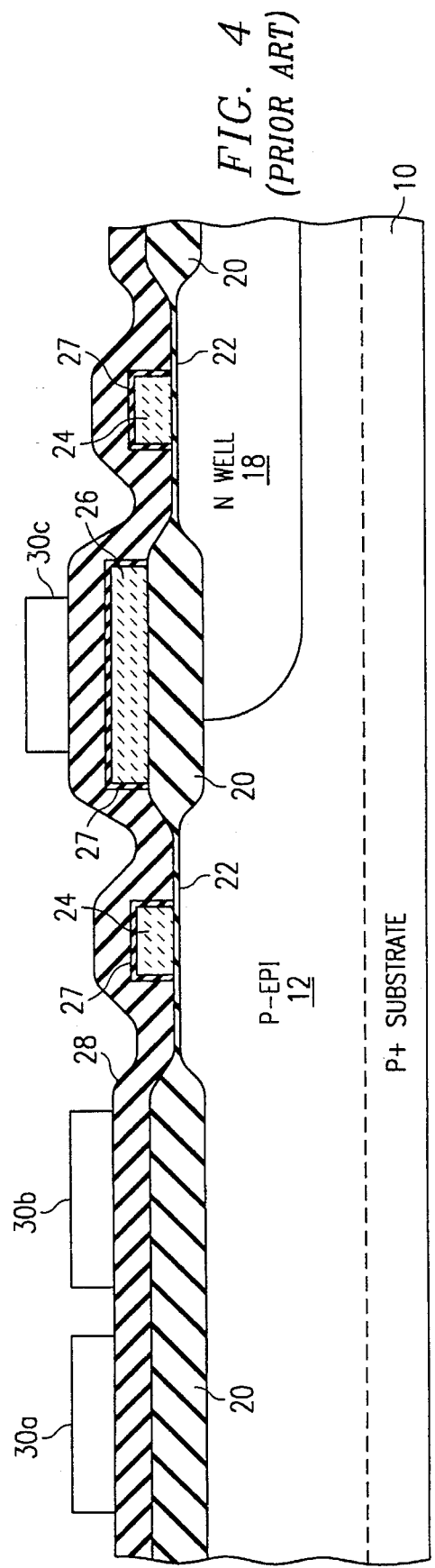
FIG. 3 (PRIOR ART)
FIG. 4 (PRIOR ART)

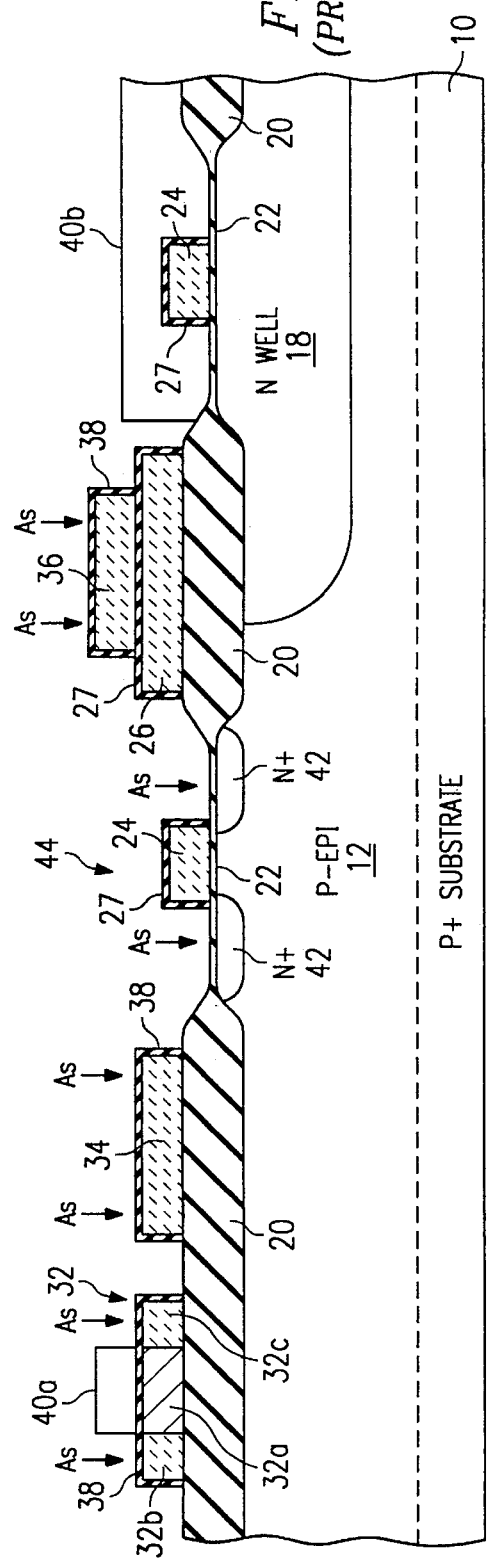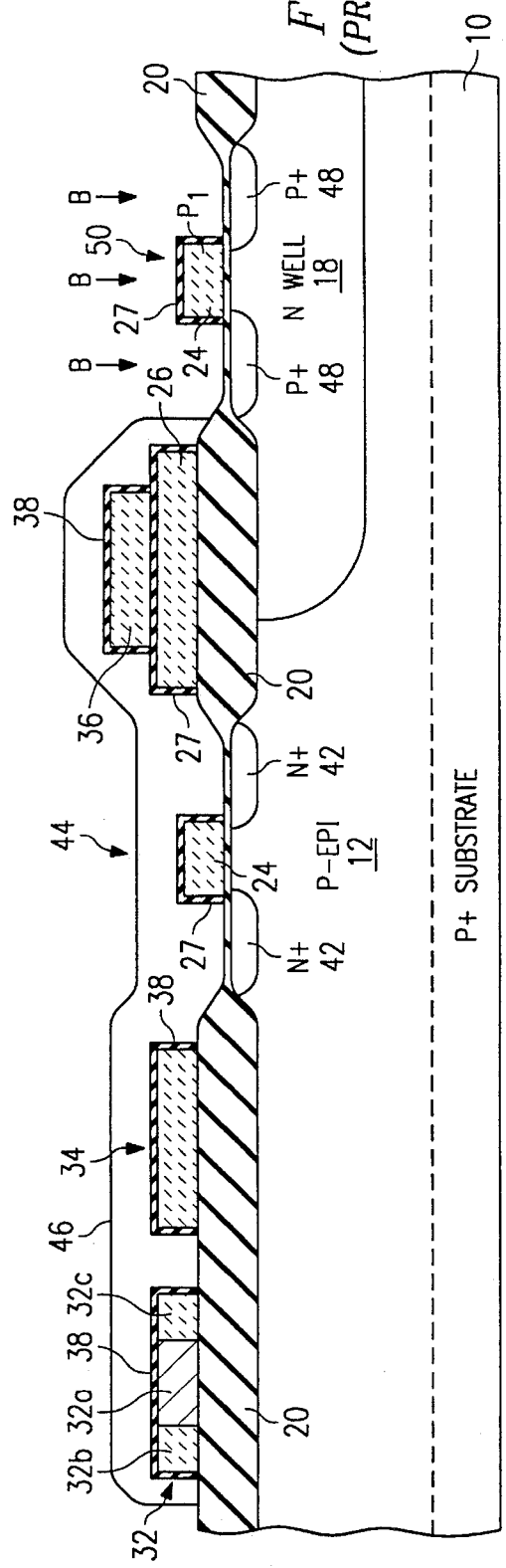

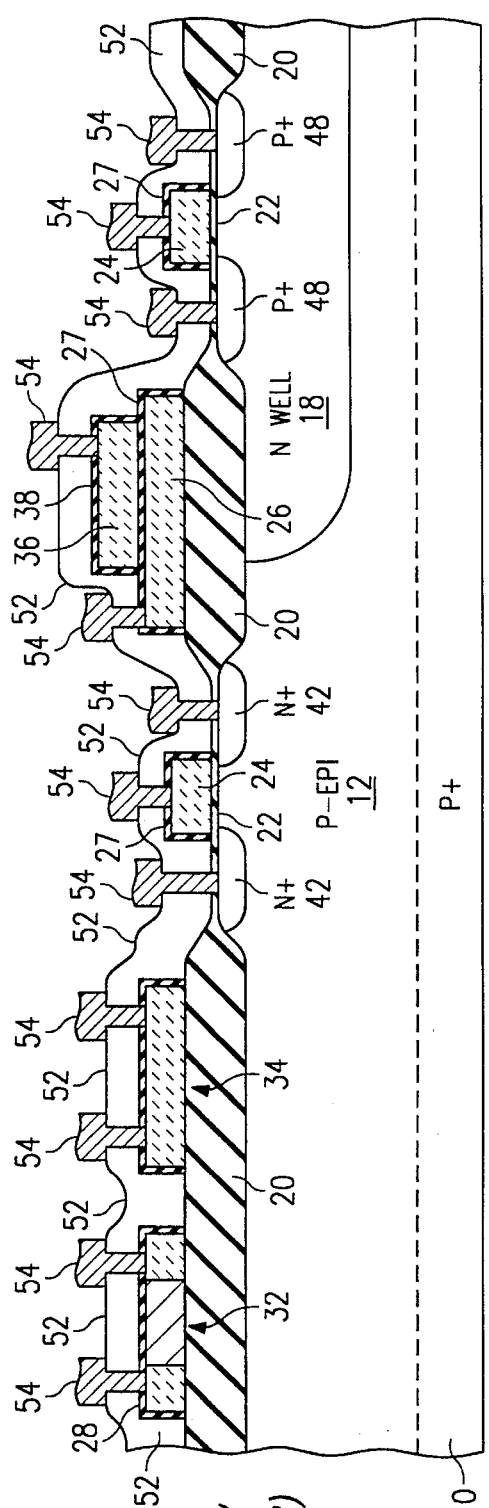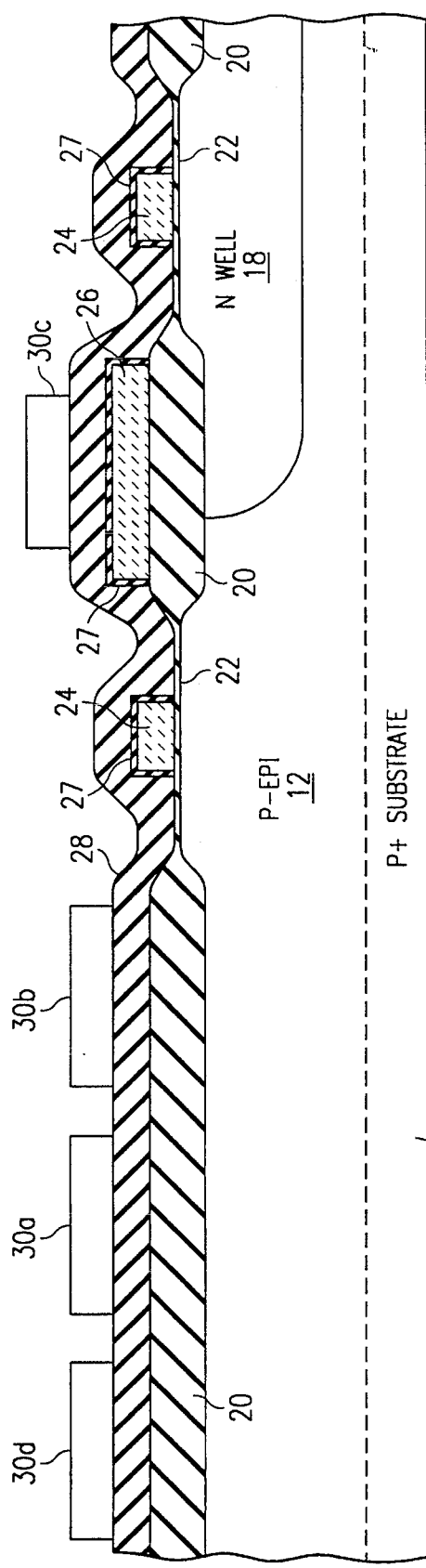
FIG. 7 (PRIOR ART)
FIG. 8

SEMICONDUCTOR DEVICE HAVING POLYSILICON RESISTOR WITH LOW TEMPERATURE COEFFICIENT

This is a division of application Ser. No. 08/247,443, filed May 23, 1994, now U.S. Pat. No. 5,489,547.

FIELD OF THE INVENTION

This invention relates generally to semiconductor devices and, more particularly, to a semiconductor device having a polysilicon resistor with a low temperature coefficient and a method of fabrication thereof.

BACKGROUND OF THE INVENTION

Precision resistors are often required in analog CMOS and BiCMOS integrated circuits. Where a conventional double-level polysilicon process is used to fabricate an integrated circuit requiring precision resistors, several competing factors must be considered in determining how the precision resistors will be implemented. These factors include the required accuracy of capacitors in the circuit, the importance of minimizing the size of any non-precision resistors in the circuit, the level of precision the most precise resistors are required to exhibit, and cost.

The competing nature of these factors is apparent in the conventional double-level polysilicon process shown in FIGS. 1–7. FIGS. 1–7 are cross-sectional elevation views showing successive stages in the fabrication of a CMOS device having two polysilicon resistors, each with a different sheet resistance, and a capacitor using a double-level polysilicon process according to the prior art.

Referring to FIG. 1, fabrication of the CMOS device begins with the formation of P-epitaxial layer 12 on P+ substrate 10. P+ substrate 10 has a thickness of about 625 microns and resistivity of about 0.015 $\Omega$-cm. P-epitaxial layer 12 has a thickness of about 20 microns and resistivity of about 6–8 $\Omega$-cm. An oxide layer 14 is formed over P-epitaxial layer 12 and patterned and etched to form a window exposing the surface of epitaxial layer 12 at area 16. A dopant, such as phosphorus, is then implanted with a dose of 3.7E12 atoms/cm$^2$ at 150 keV in P-epitaxial layer 12 through the window at area 16 to form N well 18. During the diffusion of N well 18, oxide layer 14 grows in the window to form a recessed oxide region at area 16 resulting in the structure shown in FIG. 1.

Oxide layer 14 is then removed and a pad oxide layer (not shown) having a thickness of about 500 Angstroms is formed over P-epitaxial layer 12 and N well 18. A nitfide layer (not shown) having a thickness of about 400 Angstroms is formed over the pad oxide layer. The nitride layer is then patterned using photolithographic techniques and etched to expose areas between moat regions. Conventional Boron and Phosphorous channel stop implants (not shown) may optionally be performed at this point. Thick field oxide regions 20 are then thermally grown to a thickness of about 12000 Angstroms in the exposed areas. The remaining portions of the nitride layer and pad oxide layer are then removed by etching. A gate oxide layer 22 is then thermally grown over the face of epitaxial layer 12 and N well 18 between field oxide regions 20 to a thickness of about 425 Angstroms resulting in the structure of FIG. 2.

A first polysilicon layer having a thickness of about 5000 Angstroms is then deposited over gate oxide layer 22 and field oxide regions 20 and heavily doped with an N type dopant, for example by implanting phosphorus at a dose of 1.6E16 atoms/cm$^2$ at 60 keV, and annealed at 900 degrees Centigrade for 30 minutes to render its sheet resistance low (about 20$\Omega$ per square). Alternatively, the polysilicon layer could be doped in a furnace using POCl$_3$ as a dopant source. For example, a deposition time of 10 minutes at 950 degrees Centigrade would give a sheet resistance of 20$\Omega$ per square. The first polysilicon layer is patterned and etched to form transistor gates 24 and lower capacitor plate 26. The low sheet resistance of the first polysilicon layer insures that gates 24 will be of low resistance and that the voltage coefficient of capacitance of lower capacitor plate 26 will be minimized.

An interlevel dielectric layer 27 is then formed over gates 24 and lower capacitor plate 26 to a thickness of about 200–1000 Angstroms. Interlevel dielectric layer 27 may be a formed from either a single grown or deposited oxide layer or from alternating layers of oxide, nitride, and oxide. A second polysilicon layer 28 having a thickness of about 5000 Angstroms is then deposited at 620 degrees Centigrade over interlevel dielectric layer 27 and those portions of gate oxide layer 22 and field oxide regions 20 that are exposed. Second polysilicon layer 28 is lightly doped with an N type dopant to render its sheet resistance high (in the range of about 500–1000 ohms/square), resulting in the structure shown in FIG. 3. This doping may be accomplished, for example, by implanting phosphorous at a dose of 1.7E15 atoms/cm$^2$ at 60KeV and then annealing at 900 degrees Centigrade for 30 minutes.

A layer of photoresist is then formed over second polysilicon layer 28 and patterned to form resist mask regions 30a, 30b, and 30c, resulting in the structure shown in FIG. 4. Resist mask regions 30a and 30b define a pair of resistors in second polysilicon layer 28. Resist mask region 30c defines an upper capacitor plate in second polysilicon layer 28.

With resist mask regions 30a, 30b, and 30c in place, second polysilicon layer 28 is etched to form resistors 32 and 34 over a field oxide region 20 and upper capacitor plate 36 over lower capacitor plate 26. Resist mask regions 30a, 30b, and 30c are then removed and an interlevel dielectric layer 38 is formed over resistors 32 and 34 and over upper capacitor plate 36 to a thickness of about 300 Angstroms. Dielectric layer 38, like dielectric layer 27, may be formed from either a single oxide layer or alternating layers of oxide, nitride, and oxide. A layer of photoresist is then formed over the structure and patterned to form resist mask regions 40a and 40b. Resist mask region 40a is formed over the center portion 32a of resistor 32 leaving end portions 32b and 32c of resistor 32 uncovered. Resist mask region 40b is formed over an area that will contain PMOS devices.

Areas not covered by resist mask regions 40a and 40b are doped with an N type dopant, for example by implanting arsenic with a dose of 8.0E15 atoms/cm$^2$ at 135 keV. This forms a pair of N+ source/drain regions 42 for NMOS transistor 44 that are self-aligned with a gate 24 and heavily dopes resistor 34, upper capacitor plate 36, and end portions 32b and 32c of resistor 32. An anneal is then performed at 1000 degrees Centigrade for 30 minutes resulting in the structure shown in FIG. 5. As a result of this N type doping, resistor 34, upper capacitor plate 36, and end portions 32b and 32c of resistor 32 have a low sheet resistance of approximately 50–70 ohms/square.

Resist mask regions 40a and 40b are then removed and a layer of photoresist is formed over the structure and patterned to form resist mask region 46. Resist mask region 46 is formed over resistors 32 and 34, transistor 44, and upper and lower capacitor plates 26 and 36 leaving an area in which a PMOS device will be formed. The areas not covered by resist mask region 46 are doped with an P type dopant, for example by implanting boron with a dose of 4.0E15 atoms/cm$^2$ at 40 keV. This forms a pair of P+ source/drain regions 48 for PMOS transistor 50 that are self-aligned with a gate 24. An anneal is then performed at 950 degrees Centigrade for 45 minutes resulting in the structure shown in FIG. 6.

Photoresist mask region 46 is then removed and a doped glass layer (MLO) 52 having a thickness of about 10000 Angstroms is then formed on the surface of the wafer and patterned and etched to fore windows extending through layer 52 and dielectric layer 38 to expose contact areas on resistors 32 and 34 and upper capacitor plate 36, through layer 52 and dielectric layer 27 to expose contact areas on gates 24 and lower capacitor plate 26, and through layer 52 and gate oxide layer 22 to expose contact areas on N+ source/drain regions 42 and P+ source/drain regions 48.

A metal layer is then deposited over the wafer and patterned and etched to form contacts 54 for contacting gates 24, source/drain regions 42 and 48, capacitor plates 26 and 36, end portions 32b and 32c of resistor 32, and end portions of resistor 34. This results in the structure shown in FIG. 7.

Where a circuit design mandates very accurate capacitors, non-precision resistors of minimum size, and low cost, this prior art process is suitable. This process yields accurate polysilicon capacitors, such as capacitor 37, since heavily doped lower and upper capacitor plates 26 and 36 have low sheet resistance values to minimize the voltage coefficient of capacitance. This process also yields non-precision resistors, such as resistor 32, that consume little silicon area since they are made up primarily of center portion 32a which is lightly doped to exhibit high sheet resistance values. This process is also low in cost since it is simple and requires relatively few steps.

This process does however have drawbacks where a circuit design requires resistors that are very precise. Precision resistors should have low temperature coefficients. This process produces resistors, such as resistor 32, that have high sheet resistances and therefore large negative temperature coefficients and resistors, such as resistor 34, that have low sheet resistances and therefore large positive temperature coefficients. Where this process alone must be relied on to produce a precision resistor, resistors with counterbalancing temperature coefficients can be paired in an attempt to produce a single resistor having a low temperature coefficient. By pairing a negative temperature coefficient resistor, such as resistor 32, with a positive temperature coefficient resistor, such as resistor 34, the resulting combination resistor should have a low temperature coefficient. In practice, however, the added design complexity for such combination resistors, inaccuracies resulting from the fact that two resistors are required, and the fact that the effect of possible process variations on the two resistors and their interaction are difficult to predict make this approach cumbersome.

One known approach for dealing with this problem is the use of thin-film resistors as precision resistors. Thin-film resistors provide low temperature coefficients over a wide range of sheet resistances. In order to fabricate a thin-film resistor, an additional deposition, pattern, and etch would have to be performed. Typical materials for such resistors are Nickrome, tantalum, or Cermet (Cr-SiO). A drawback to this solution is the high cost of the complex, additional processing required for thin-film resistor fabrication.

Another known approach for dealing with this problem is to initially dope the second layer of polysilicon moderately instead of lightly with the result that portion 32a of resistor 32 has a moderate sheet resistance (approximately 160 ohms/square) and therefore a low temperature coefficient desired for a precision resistor. A drawback to this approach is that good temperature performance is achieved at the cost of silicon real estate since resistors 32 take up considerably more silicon area when their sheet resistance is moderate as opposed to when their sheet resistance is high. Furthermore, since all resistors have this moderate sheet resistance (or a lower sheet resistance if the resistor is later implanted with the N+ source/drain implant), all large-valued resistors will increase in size not just those needing the low temperature coefficient of resistance.

Accordingly, a need exists for an integrated circuit device having accurate capacitors, non-precision resistors of high sheet resistance, and low temperature coefficient precision resistors that can be fabricated with a double-level polysilicon process without additional, complex process steps.

SUMMARY OF THE INVENTION

In accordance with the invention, a method of forming a semiconductor device includes forming a polysilicon resistor over and insulated from a semiconductor layer, the polysilicon resistor being of a first conductivity type and having a first temperature coefficient of resistance. The polysilicon resistor is doped with a dopant of a second conductivity type opposite the first conductivity type. The step of doping causes the polysilicon resistor to be of the second conductivity type and to have a second temperature coefficient of resistance that is closer to zero than said first temperature coefficient of resistance. In one embodiment of the invention, the polysilicon resistor is initially n type and is counterdoped to be p type with a temperature coefficient of about zero by an implant that also forms p type source/drain regions.

It is an advantage of the invention that a precision polysilicon resistor having a low temperature coefficient can be provided in a double-level polysilicon process without altering available capacitors or high and low sheet resistors or adversely impacting PMOS transistors. The process of the invention is thus compatible with standard cell methodology. It is an additional advantage that fabrication of the precision polysilicon resistor does not require any additional process steps.

BRIEF DESCRIPTION OF THE DRAWINGS

In the drawings:

FIGS. 1–7 are cross-sectional elevation views showing successive stages in the fabrications of a CMOS device using a double-level polysilicon process according to the prior art;

FIGS. 8–11 are cross-sectional elevation views showing successive stages in the fabrication of a CMOS device having a polysilicon resistor with a low temperature coefficient according to the invention;

DETAILED DESCRIPTION OF THE INVENTION

Figure 9:
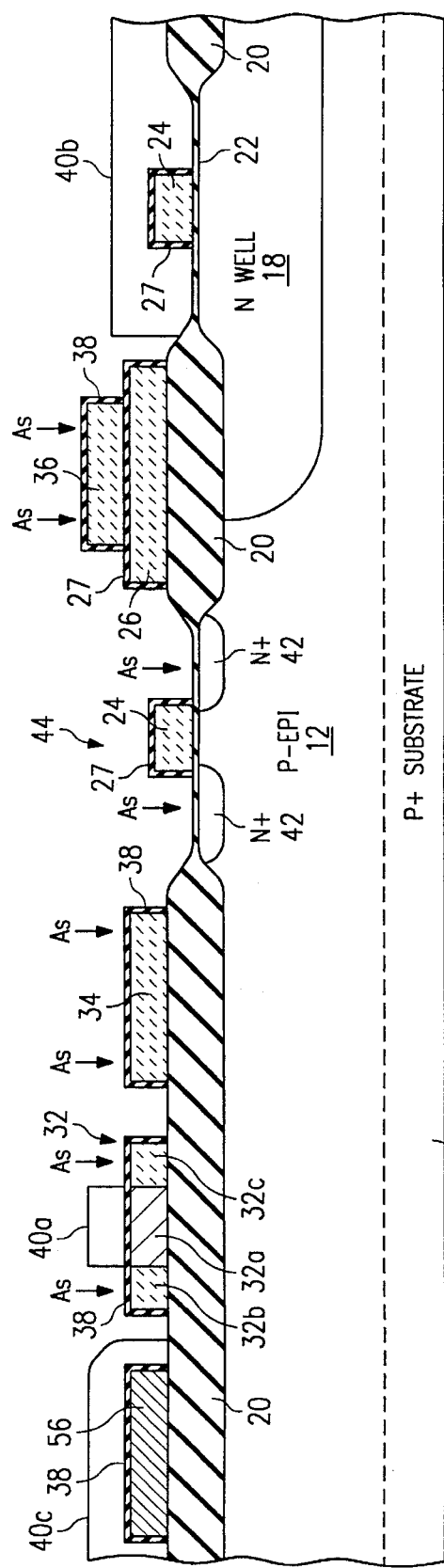

The fabrication of a CMOS device having a polysilicon resistor with a low temperature coefficient according to the invention will now be described with reference to FIGS. 8–11. Initially, the process of the invention uses the same steps discussed with respect to FIGS. 1–3 to produce the structure of FIG. 3.

A layer of photoresist is then formed over second polysilicon layer 28 and patterned to form resist mask regions 30a, 30b, 30c, and 30d resulting in the structure shown in FIG. 8. Resist mask regions 30a, 30b, and 30d define three resistors in second polysilicon layer 28. Resist mask region 30c defines an upper capacitor plate in second polysilicon layer 28.

With resist mask regions 30a, 30b, 30c, and 30d in place, second polysilicon layer 28 is etched to form resistors 32, 34, and 56 over a field oxide region 20 and upper capacitor plate 36 over lower capacitor plate 26. Resist mask regions 30a, 30b, 30c, and 30d are then removed and an interlevel dielectric layer 38 is formed over resistors 32, 34, and 56 and over upper capacitor plate 36 to a thickness of about 300 Angstroms. A layer of photoresist is then formed the structure and patterned to form resist mask regions 40a, 40b, and 40c. Resist mask region 40a is formed over the center portion 32a of resistor 32 leaving end portions 32b and 32c of resistor 32 uncovered. Resist mask region 40b is formed over an area that will contain PMOS devices. Resist mask 40c is formed over resistor 56.

Areas not covered by resist mask regions 40a, 40b, and 40c are doped with an N type dopant, for example by implanting arsenic with a dose of 8.0E 15 atoms/cm$^2$ at 135 keV. This forms a pair of N+ source/drain regions 42 for NMOS transistor 44 that are self-aligned a with gate 24 and heavily dopes resistor 34, upper capacitor plate 36, and end portions 32b and 32c of resistor 32. An anneal is then performed at 1000 degrees Centigrade for 30 minutes resulting in the structure shown in FIG. 9. As a result of this N type doping, resistor 34, upper capacitor plate 36, and end portions 32b and 32c of resistor 32 have a low sheet resistance of approximately 50–70 ohms/square.

Figure 10:
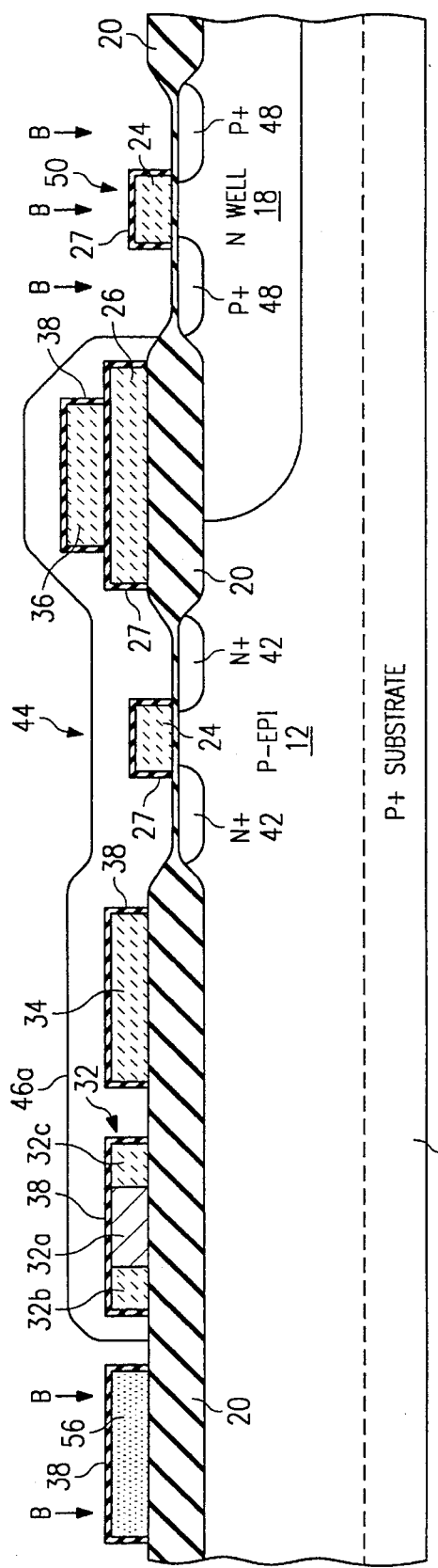
Figure 11:
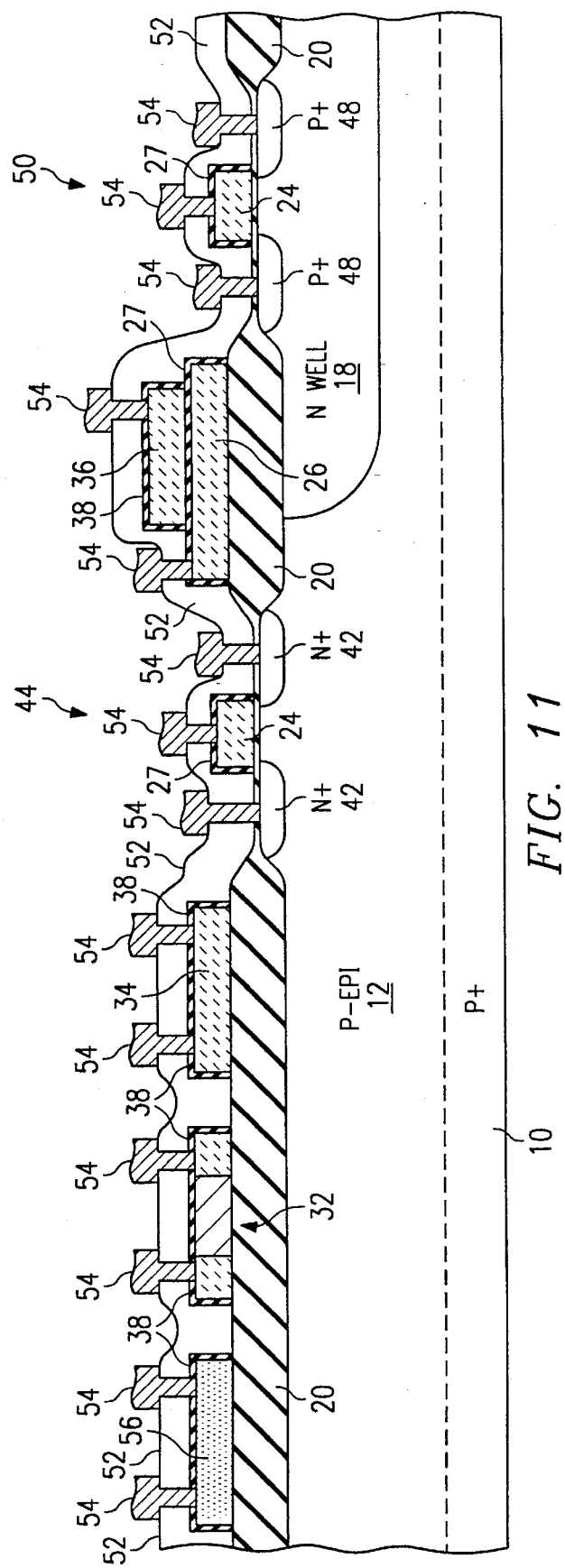

A layer of photoresist is then formed over the structure and patterned to form resist mask region 46a, as seen in FIG. 10. Resist mask region 46a is formed over resistors 32 and 34, transistor 44, and upper and lower capacitor plates 26 and 36. Resistor 56 and an area in which a PMOS device will be formed are exposed through windows in the photoresist layer. The areas not covered by resist mask region 46a are doped with a P type dopant, for example by implanting boron with a dose in the range of 3.0E15–6.0E15 atoms/cm$^2$ at 40 keV. An anneal is then performed at 950 degrees Centigrade for 45 minutes resulting in the structure shown in FIG. 10. This forms a pair of P+ source/drain regions 48 for PMOS transistor 50 that are self-aligned with a gate 24 and counterdopes resistor 56 to convert it from an N type resistor with a high sheet resistance to a P type resistor with a moderate sheet resistance in the range of about 150–350 ohms/square. With a sheet resistance in this range, resistor exhibits a low temperature coefficient. In a preferred embodiment, the P type doping is performed by implanting boron with a dose of 4.0E15 atoms/cm$^2$ at 40 keV with the result that resistor 56 has a sheet resistance of about 170 ohms/square and a temperature coefficient of resistance of approximately zero.

Photoresist mask region 46a is then removed and a doped glass layer (MLO) 52 having a thickness of about 10000 Angstroms is formed on the surface of the wafer and patterned and etched to form windows extending through layer 52 and dielectric layer 38 to expose contact areas on resistors 32, 34, and 56 and upper capacitor plate 36, through layer 52 and dielectric layer 27 to expose contact areas on gates 24 and lower capacitor plate 26, and through layer 52 and gate oxide layer 22 to expose contact areas on N+ source/drain regions 42 and P+ source/drain regions 48.

A metal layer is then deposited over the wafer and patterned and etched to form contacts 54 for contacting gates 24, source/drain regions 42 and 48, capacitor plates 26 and 36, end portions 32b and 32c of resistor 32, and end portions of resistors 34 and 56. This results in the structure shown in FIG. 11.

Figure 12:
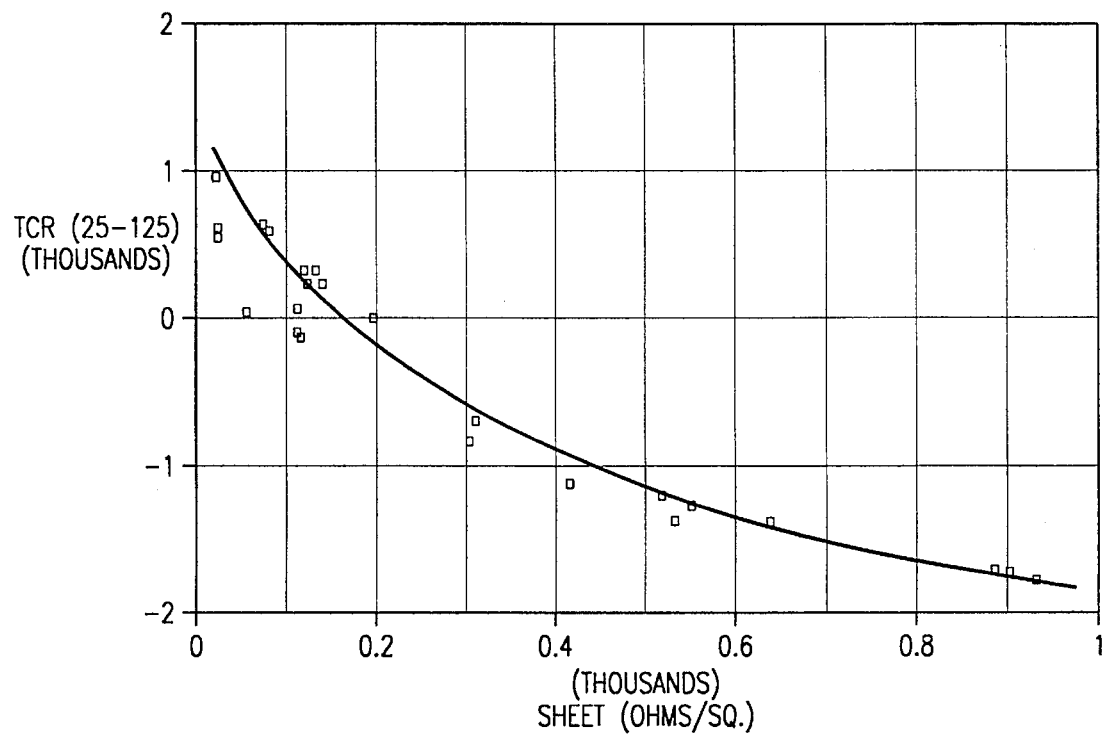
FIG. 12 is a graph showing the temperature coefficient of the resistance of polysilicon as a function of its sheet resistance.

FIG. 12 is a graph showing the temperature coefficient of the resistance of polysilicon as a function of its sheet resistance for polysilicon of a thickness of 5000 Angstroms deposited at a temperature of 620 degrees Centigrade. As seen in FIG. 12, the sheet resistance in the range of about 150–350 ohms/square possessed by resistor 56 results in a low temperature coefficient of resistance. In the preferred embodiment in which resistor 56 has a sheet resistance of about 170 ohms/square, the temperature coefficient of resistance of resistor is about zero. The low temperature coefficient of resistor 56 makes it suitable for applications where a precision resistor is desired. Since the P type implant that results in resistor 56 having a low temperature coefficient is also used to form P+ source/drain regions 48, precision resistor 56 is available without any additional process steps.

In contrast to resistor 56, resistor 34, with its low sheet resistance of approximately 50–70 ohms/square, has a high positive temperature coefficient of about +600 to +800 parts per million per degree Centigrade as seen in FIG. 12. Resistor 32, with its sheet resistance of approximately 500–1000 ohms/square, has a high negative temperature coefficient of about −1500 to −1900 parts per million per degree Centigrade as seen in FIG. 12.

Figure 13:
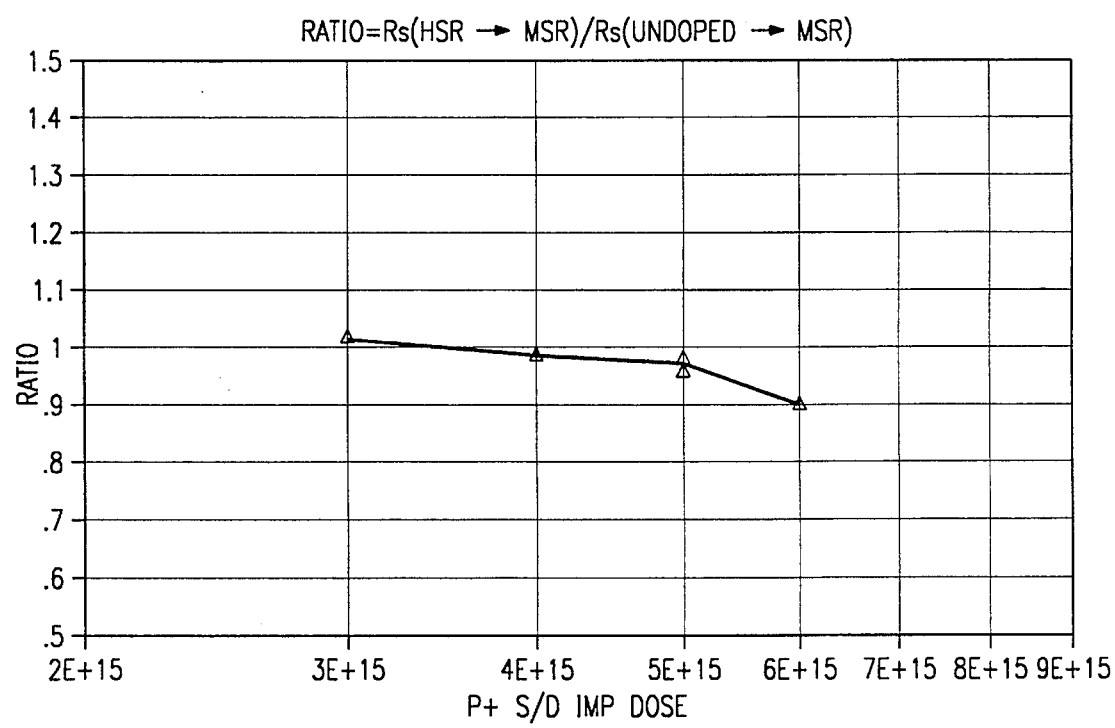
FIG. 13 is a graph showing the ratio of the sheet resistance of polysilicon initially doped with N type material so as to have a high sheet resistance and subsequently implanted with P type material so as to have a medium sheet resistance to the sheet resistance of undoped polysilicon that is implanted with P type material so as to have a medium sheet resistance as a function of the P type implant dose.

FIG. 13 is a graph showing the ratio of the sheet resistance of polysilicon initially doped with N type material so as to have a high sheet resistance and subsequently implanted with P type material so as to have a moderate sheet resistance to the sheet resistance of undoped polysilicon that is implanted with P type material so as to have a moderate sheet resistance as a function of the P type implant dose. As seen in FIG. 13, for P type implant doses in the range of 3E15 to 6E15 atoms/cm$^2$, the ratio is approximately 1 indicating that the N type polysilicon resistor with high sheet resistance and the undoped polysilicon respond similarly to the P type implant counterdoping. The significance of FIG. 13 is the fact it indicates that the high sheet resistance of N type resistor 56 prior to counterdoping does not have to be approximately 500–1000 ohms/square but could be as high as 1000–2000 ohms/square to further aid in silicon area conservation and still result in a moderate sheet resistance P type resistor having a low temperature coefficient.

Figure 14:
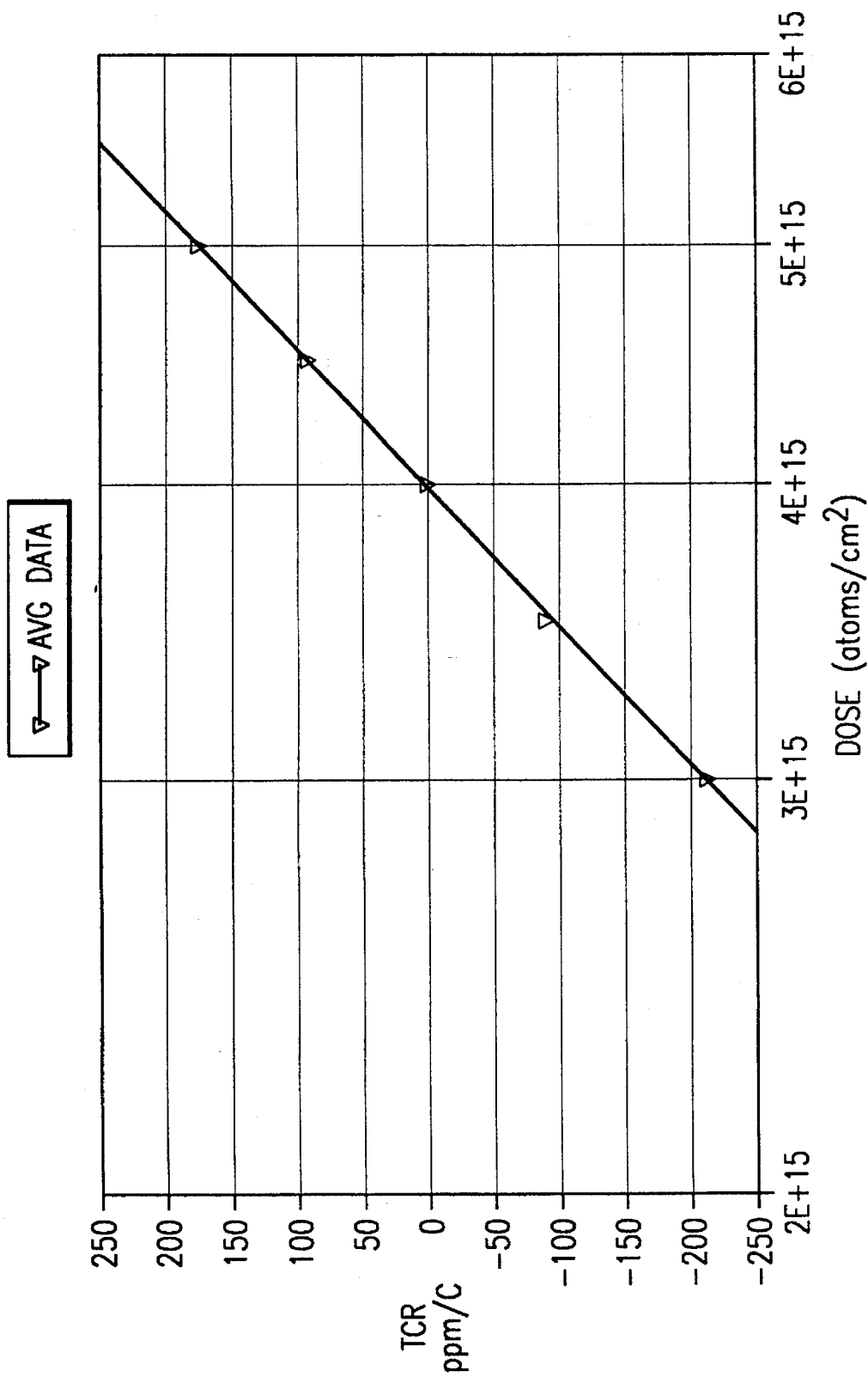
FIG. 14 is a graph showing the temperature coefficient of resistance of polysilicon initially doped with N type material so as to have a high sheet resistance and subsequently implanted with P type material so as to have a medium sheet resistance as a function of P+ source/drain implant dose.

FIG. 14 is a graph showing the temperature coefficient of resistance of polysilicon initially doped to be N type with a high sheet resistance and subsequently counterdoped to be P type with a moderate sheet resistance as a function of P+ source/drain implant dose. As seen in FIG. 14, the P+ implant dose of 4E15 atoms/cm$^2$ of the preferred embodiment resulted in a resistor with a temperature coefficient of resistance of approximately zero. This dose is within the range of a typical P type source/drain implant dose thus permitting the low temperature coefficient precision resistor to be achieved without adversely impacting PMOS transistor characteristics.

It is an advantage of the invention that a precision polysilicon resistor having a low temperature coefficient can be provided in a double-level polysilicon process without altering available capacitors or high and low sheet resistors or adversely impacting PMOS transistors. The process of the invention is thus compatible with standard cell methodology. It is an additional advantage that fabrication of the precision polysilicon resistor does not require any additional process steps.

A preferred embodiment has been described in detail hereinabove. It is to be understood that the scope of the invention also comprehends embodiments different from that described, yet within the scope of the claims.

For example, the process could be incorporated into a BiCMOS process flow to produce a BiCMOS device, sidewall spacers could be provided on the sidewalls of the transistors gates, lightly-doped source/drain regions could be used, and the gate, source/drain, resistor, and capacitor regions in contact with the metal contacts could be silicided.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A semiconductor device, comprising:

a semiconductor layer;

a first polysilicon resistor of a first conductivity type formed over said semiconductor layer;

a second polysilicon resistor of a second conductivity type opposite said first conductivity type formed over said semiconductor layer;

said first and second polysilicon resistors doped with a first dose of a dopant of said second conductivity type, said first dose giving said second polysilicon resistor a sheet resistance in the range from about 500 to 2000 ohms/square, said first polysilicon resistor additionally doped with a second dose of a dopant of said first conductivity type so as to have a sheet resistance in the range of about 150–350 ohms/square.

2. The semiconductor device of claim 1 further comprising:

a third polysilicon resistor of said second conductivity type formed over said semiconductor layer and having a sheet resistance less than about 60 ohms/square.

3. The semiconductor device of claim 1 in which the sheet resistance of said first resistor is about 170 ohms/square.

4. A semiconductor device, comprising:

a semiconductor layer;

a first polysilicon resistor of a first conductivity type formed over said semiconductor layer;

a second polysilicon resistor of a second conductivity type opposite said first conductivity type formed over said semiconductor layer;

said first and second polysilicon resistors doped with a first dose of a dopant of said second conductivity type, said first dose giving said second polysilicon resistor a positive temperature coefficient, said first polysilicon resistor additionally doped with a second dose of a dopant of said second conductivity type so as to have a temperature coefficient of resistance of about zero.

* * * * *